United States Patent
Machuca et al.

(10) Patent No.: US 7,455,565 B2
(45) Date of Patent: Nov. 25, 2008

(54) FABRICATION OF GROUP III-NITRIDE PHOTOCATHODE HAVING CS ACTIVATION LAYER

(75) Inventors: Francisco Machuca, San Francisco, CA (US); Zhi Liu, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 109 days.

(21) Appl. No.: 11/378,133

(22) Filed: Mar. 16, 2006

(65) Prior Publication Data

US 2006/0170324 A1 Aug. 3, 2006

Related U.S. Application Data

(63) Continuation-in-part of application No. 11/250,158, filed on Oct. 13, 2005, now abandoned.

(60) Provisional application No. 60/618,643, filed on Oct. 13, 2004.

(51) Int. Cl.
*H01J 9/04* (2006.01)
*H01J 9/02* (2006.01)

(52) U.S. Cl. .............................. 445/51; 445/35; 134/19

(58) Field of Classification Search ........................ None
See application file for complete search history.

(56) References Cited

U.S. PATENT DOCUMENTS

| 4,614,961 | A | | 9/1986 | Khan et al. ..................... 357/30 |
|---|---|---|---|---|
| 4,616,248 | A | * | 10/1986 | Khan et al. ..................... 257/11 |
| 5,182,670 | A | | 1/1993 | Khan et al. ................. 359/359 |
| 5,684,360 | A | | 11/1997 | Baum et al. ................. 313/542 |
| 5,697,826 | A | | 12/1997 | Kim et al. ....................... 445/58 |
| 5,705,089 | A | * | 1/1998 | Sugihara et al. ............ 252/79.1 |
| 5,880,481 | A | | 3/1999 | Kroon et al. ................... 257/10 |
| 6,303,918 | B1 | | 10/2001 | Estrera et al. ................ 250/207 |
| 6,429,443 | B1 | | 8/2002 | Mankos et al. ......... 250/492.24 |
| 6,440,214 | B1 | * | 8/2002 | Hooper et al. ................. 117/94 |
| 6,759,800 | B1 | | 7/2004 | Fernandez et al. .......... 313/373 |
| 2004/0161904 | A1 | * | 8/2004 | Berne et al. ................. 438/455 |

OTHER PUBLICATIONS

Machuca, Francisco et al., "Simple Method for Cleaning Gallium Nitride (0001)," J. Vac. Sci. Technol. A 20(5), Sep./Oct. 2002, pp. 1784-1786.

* cited by examiner

*Primary Examiner*—Joseph L. Williams
*Assistant Examiner*—Britt Hanley
(74) *Attorney, Agent, or Firm*—Lumen Patent Firm

(57) ABSTRACT

Improved photocathodes are provided by a fabrication method including steps of wet chemically cleaning the photocathode emission surface (to reduce the level of cleaning-induced surface damage), two stage heat treatment (to complete the cleaning without desorbing nitrogen from the emission surface), followed by activation with Cs only, as opposed to Cs—O. The resulting photocathodes have improved performance (lifetime, brightness, efficiency) compared to conventional photocathodes, and are thus attractive candidates for demanding photocathode applications.

7 Claims, 7 Drawing Sheets

402 — provide substrate having a group-III nitride light absorbing region

404 — chemically cleaning an emission surface of the light absorbing region with a wet chemical process 406 — heat treatment (first phase) temperature ≥ 300 C 408 — heat treatment (second phase) temperature is greater than first phase temperature activating the emission surface by providing Cs (but not oxygen) to the surface

410

402 — provide substrate having a group-III nitride light absorbing region

404 — chemically cleaning an emission surface of the light absorbing region with a wet chemical process 406 — heat treatment (first phase) temperature ≥ 300 C 408 — heat treatment (second phase) temperature is greater than first phase temperature activating the emission surface by providing Cs (but not oxygen) to the surface

FABRICATION OF GROUP III-NITRIDE PHOTOCATHODE HAVING CS ACTIVATION LAYER

CROSS REFERENCE TO RELATED APPLICATIONS

This application is a continuation-in-part of U.S. application Ser. No. 11/250,158, filed on Oct. 13, 2005 now abandoned, and entitled "Group III-nitride photocathode having Cs activation layer". U.S. application Ser. No. 11/250,158 claims the benefit of U.S. provisional application 60/618,643, filed on Oct. 13, 2004.

GOVERNMENT SPONSORSHIP

This invention was made with Government support under grant number MDA972-01-1-0021 from DARPA and under contract F33615-00-1-1728 from the Air Force. The Government has certain rights in this invention.

FIELD OF THE INVENTION

This invention relates to photocathodes.

BACKGROUND

A photocathode is a device which emits electrons responsive to incident electromagnetic radiation, typically in the optical frequency range (e.g., UV, IR or visible ranges). Semiconductor materials have been under investigation for some time as suitable photocathode materials, and the relatively recent development of semiconducting group III-nitride materials has led to corresponding photocathode developments. For example, AlGaN photocathodes are considered in U.S. Pat. Nos. 4,614,961, 4,616,248, 5,182,670, and U.S. Pat. No. 5,697,826.

There are many aspects of photocathode design that have been considered for improving performance. For example, U.S. Pat. No. 5,880,481 considers covering the emissive surface of a photocathode with a semiconductor material having a larger bandgap than the photocathode light absorbing material to improve emission efficiency. U.S. Pat. No. 6,303,918 considers a hardened photocathode. U.S. Pat. No. 6,759,800 considers a photocathode on a transparent substrate. Such transparent photocathodes are especially useful in applications such as e-beam lithography. U.S. Pat. No. 6,429,443 considers generation of multiple electron beams from a single photocathode with multiple optical sources. U.S. Pat. No. 5,684,360 considers a photocathode having a transparent substrate and having an ultra-small emission area for improving brightness.

Since the basic operation of a photocathode requires emission of electrons from a surface of the photocathode, photocathode performance is sensitively dependent on surface effects, which are notoriously sensitive to details of surface preparation procedures and which are notoriously material system dependent. Processes and procedures that work well in one material system are not especially likely to work in another material system, unless the two material systems are very similar. Although there is general agreement as to what properties are desirable in a photocathode (e.g., high efficiency, high brightness, long lifetime, and negative electron affinity), suggestions for how to provide such performance tend to focus on specific processes for specific material systems, since broad generalization is rarely applicable.

One area of particular concern in photocathode fabrication is the surface preparation or cleaning process performed after the photocathode material is grown or deposited. Conventional techniques tend to employ dry processing techniques (e.g., ion bombardment) followed by an annealing step to remove surface damage induced by the ion bombardment. Unfortunately, the annealing may not be able to remove all the defects, and the remaining defects can severely compromise photocathode performance (reduced efficiency and/or shortened lifetime). Wet chemical processing for surface preparation of a GaN photocathode has been considered by Machuca et al., in "Simple Method for Cleaning Gallium Nitride (0001)", JVST A20(5) pp 1784-1786, 2002. In this article, a chemical cleaning step is followed by a 10 minute annealing step at an elevated temperature. Various annealing temperatures were investigated, as was the effect of performing the annealing in vacuum or in an ammonia atmosphere. The vacuum anneal is preferred in this report.

Photocathodes are under consideration for demanding applications, such as multiple e-beam lithography and microscopy. However, it can be difficult or even impossible to satisfy the performance requirements for such applications with conventional photocathodes. Accordingly, it would be an advance in the art to provide improved photocathodes and methods for fabricating such improved photocathodes.

SUMMARY

Improved photocathodes are provided by a fabrication method including steps of wet chemically cleaning the photocathode emission surface (to reduce the level of cleaning-induced surface damage), two stage heat treatment (to complete the cleaning without desorbing nitrogen from the emission surface), followed by activation with Cs only, as opposed to Cs—O. The resulting photocathodes have improved performance (lifetime, brightness, efficiency) compared to conventional photocathodes, and are thus attractive candidates for demanding photocathode applications. Further aspects of improved photocathode performance and applications for such improved photocathodes are described in the reminder of this summary.

One viable approach to multiple electron beam lithography and microscopy is to use a hybrid optical-electron system involving an array of light spots (fiber coupled lasers, individual diode lasers, or some bright high quality lamp), passing through light optics to condition multiple light beams for highest quality of focus and positioning onto a photocathode that is held within vacuum. The fundamental conversion of the array of light spots into a corresponding array of electron beams occurs in the photocathode. Yet to date, no photocathode proposed can satisfy the stringent requirements set by the e-beam lithography and microscopy industries in terms of: 1) efficiency of operation (long lifetimes), 2) quality of e-beams (low energy spreads, low angular divergence, high brightness), 3) ruggedness (contamination free bulk and surface), facilitating low vacuum requirements, and 4) practical wavelengths of illumination that can be modulated fast enough to satisfy writing and reading strategies utilized by e-beam tools. This invention provides a device that satisfies the criteria for a realizable multiple e-beams source that can meet anticipated lithography industry needs for at least the next decade.

According to the following three step method; absorption of light (not necessarily visible to the eye), transport of photogenerated carriers, and emission of carriers, the group III-nitride photocathode converts light radiation in the spectral range of 200 nm to 450 nm to electric currents emitted into free space. These photocathodes are highly sensitive to the absorption of light making up the ultra violet portion of the spectrum and out to the uv-blue. The basic aim of the photocathode is to convert multiple light spots into multiple electron beams, defining a hybrid optical-electron system for the generation of multiple electron beams for e-beam lithography and/or microscopy.

The photocathode includes four material layers; top layer (emission surface) is a cesium monolayer (activation layer), second from the top is the p-type (highly doped) group III-nitride layer (active layer), third layer from the top is a thin aluminum gallium nitride layer (buffer layer), and the final layer is the double side polished basal plane single crystal sapphire substrate (support window). Preferred dimensions for the photocathode heterostructure are; 1 monolayer of the top most activation layer, 0.1 to 1.0 micrometers of single crystal highly doped p-type group III-nitride (hexagonal or cubic structure), 0.05 micrometers of aluminum nitride, and 300-500 um sapphire substrate. The group III-nitride active layer can be a continuous or graded material of $Al_xGa_{1-x}N$ for the uv wavelengths, or $In_xGa_{1-x}N$ for the uv-blue wavelengths of interest. In the preferred embodiment of the device, low mole fractions of Indium will be described in order to take advantage of uv-blue lasing wavelengths for small diffraction limited spot sizes and ultra fast GHz modulation rates necessary for high throughput e-beam printing.

The key to achieving an efficient and high performance photoemitter (high current density, low energy spread and high brightness) from a group III-nitride material is reducing the vacuum level at the surface below the conduction band minimum in its bulk, known as a negative electron affinity (NEA). Of special interest for the emitter is the low energy electron emission from the surface. This is ensured by having a mean free path longer than the film thickness and p-type doping. P-type doping guarantees the appropriate downward band bending as you approach the emitting surface. The high doping (approximately $1 \times 10^{18}$ cm$^{-3}$ hole density or greater achieving 1-6 ohm-cm sheet resistance is preferred) affords the shortest depletion layer width technologically possible at the emitting surface, minimizing the distance traveled in the presence of ionized impurities, leading to a lower degree of photo-generated carrier scattering and surface trapping before emission into free space.

Photocathodes according to the invention provide several advantages. The first advantage relates to the refractory nature of group III-nitrides, essentially owing to the large bond energies near 10 eV/atom, large dissociation energies are required to break a bond. Hence oxidation, high voltage breakdown, chemical etching, and any degradation mechanism potentially attacking the bulk or surface of the photocathode are energetically unfavorable and nonexistent. Therefore a key degradation mechanism or decay pathway for a lithography source has been eliminated leading to long operation lifetimes at high current densities and under lower operating vacuum environments.

In addition, the Cs only NEA activation of group III-nitrides employing InGaN active layers is not susceptible to contamination from the low vacuum environment or electron stimulated desorption of Cs as known in the art. Cs is tightly bound to the group III-nitride semiconductors. A high Cs coverage has been observed following heat cycles of the group III-nitride photocathode to temperatures as high as 700 C. A summary of the two properties leading to rugged and robust emission targets for the e-beam lithography and microscopy industries is shown in FIG. 1 compared with the conventional arrangement of FIG. 2. This is an enabling property of the invention that ensures long lifetimes as well as uniform emission from small (few hundred nanometers) to large illumination spots (a few millimeters) across the whole surface of the photocathode, and independent of the high current density extracted (over typical ranges of operation 0.1 to 1000 Amps/cm$^2$).

Some authors, such as Kim (U.S. Pat. No. 5,697,826) argue the necessity for an activation layer comprised of both cesium and oxygen. Our studies show the group III-nitride photocathodes are NEA emitters with cesium alone or with cesium oxide. Nienhaus et. al. has shown that for the full solid solution of AlGaN, the band gap plus the electron affinity at the surface of the solid is approximately a constant of 6.5 eV, referred to as the ionization energy of the solid. Hence as the band gap increases, the barrier to vacuum decreases, requiring a smaller change in the vacuum level position in energy to achieve an NEA emitter. This implies the NEA activation of AlGaN emitters is achieved more readily as the aluminum mole fraction increases. This is contrary to Kim's arguments for the AlGaN transmission mode photocathode. The emitters in question are in the extreme case of gallium nitride with zero mole fraction of aluminum and the $In_xGa_{1-x}N$ members, which absorb light in the uv-blue portion of the spectrum. Our photoemission results and our spectral yield curves definitively show the gallium nitride photocathode and InGaN are NEA emitters. With cesium alone the electron affinity is decreased by approximately 3.0 eV and the emission threshold in the spectral yield curve is at the bandgap of the respective photocathodes. Our studies have shown this decrease in electron affinity places the vacuum level at the surface of the solid just above the band gap edge, but below the conduction band minimum of the bulk. Therefore, the introduction of oxygen to the cesium alone dipole layer to form a cesium oxide dipole layer is of no significant enhancement in the decrease of the vacuum level and leads to deleterious lifetime effects inconsistent with the requirements of e-beam tools. In summary, for high temperature and or high intensity illumination (large current densities), cesium alone is a stable and reproducible activation layer on the group III-nitride photocathodes. This cesium alone activation layer is preferred for the high performance electron beam source for maskless lithography or electron metrology tools.

Primary variations can be afforded by altering the substrate and the buffer layer. The substrate (support window) is preferably basal plane sapphire and can be changed to a single crystal oxide or glass that can pass the radiation of interest. Secondly, anti-reflection coatings can be deposited on the back side to reduce reflection losses of light to within a percent. The thickness of this support structure is variable, owing to the lack of absorption of light by the material. Similarly, buffer layer thickness can be varied, and in addition the mole fraction of gallium can be changed. The major variation that can affect the transport of carriers in the photocathode is to grade the band gap of the active layer using either $Al_xGa_{1-x}N$ or $In_xGa_{1-x}N$. A linear composition grade introduces a built in electric field that provides a linear change in conduction band minimum energy as the emission surface is approached. With this modification, the carriers are generated where the absorption threshold is reached for the given stoichiometry of the group III-nitride alloy, depending on the wavelength of illumination. The carriers will drift in addition to diffuse to the front emitting surface of the photocathode, where an NEA surface exists. This drift effect increases transport efficiency, thereby increasing photocathode emission efficiency.

A variation is to deposit or place in physical and electrical contact an electrode on the front emitting surface and on the backside. Then a voltage may be applied across the device to allow the photo-generated carriers to be drift assisted by the externally applied field.

Photocathodes according to the invention can operate at elevated temperatures (100 C is preferred) which can increase the lifetime of the electron source without changing the energy spread of the electrons, or causing any harmful surface contamination.

A key application of photocathodes of the invention is a high performance, low vacuum requirement, rugged multiple electron beam source for highly parallel and maskless e-beam lithography or metrology. The photocathode structure is illuminated with multiple laser spots from the backside (fiber coupled laser light, many individual diode lasers, or a parallel source of light spots from a bright high quality lamp) and the beams are focused to submicrometer to millimeter diameter spots (high intensity light). The laser light passes through the window layer and the buffer layer and is absorbed in the active layer of the group III-nitride photocathode. This yields an emitted beam of electrons into free space for each light spot absorbed and guided with electromagnetic optics for multiple electron beam lithography. Alternatively the multiple electron beams can be used as the primary source for an electron microscopy metrology tool for fast parallel inspection of semiconductor wafers. A key aspect of this transmission mode structure is the uniform emitting group III-nitride surface that has low energy spreads less than 200 meV (as seen on FIG. 5) leading to small source angles and large electron-column transmissions greater than 10%, and long lifetimes greater than 50 hours per spot independent of high current density extracted (0.1 to 100 A/cm$^2$). Of special interest is the use of an InGaN photocathode where the indium mole fraction is tuned to efficiently absorb 375 nm to 405 nm light in order to facilitate the use of Nichia uv/blue laser technology or similar InGaN laser diodes.

A preferred embodiment for this application focuses a massively parallel array of uv/blue laser diodes that can be modulated between varying on and off states using electrical gating of the diodes. These diodes can be operated at varying light output power to set the electron current density per spot. Hence applying a voltage below threshold turns a light spot off and turns the e-beam off. When operating the laser above the threshold voltage the e-beam is turned on and to a given intensity level. This switching can be accomplished today with state of the art lasers at the gigahertz frequency range, necessary for high throughput e-beam lithography. Hence an array of light spots may be focused onto the backside of the photocathode, and an emerging array of electron beamlets emerge from the front surface. And importantly, each individual e-beam can be independently turned on and off leading to a massively parallel and maskless writing strategy or metrology tool for inspection.

An alternative application of photocathodes of the invention is realization of a true uv solar blind detector, having high uv sensitivity and high speed readout capability providing real time detection of fast or hot moving bodies or accelerants. Such a detector has applications in astronomy (e.g., cosmic ray detection), security (missile/rocket detection), and energy production (high temperature sensing for oil drilling). Such a detector includes a group III-nitride transmission photocathode upstream from an electron multichannel plate (MCP) with current state of the art gain on the order of 10$^6$ or greater, placed above a silicon charged couple device with fast readout rates (current state of the art 20 MHz/pixel or greater). There is an accelerating voltage of 5 kV to 10 kV applied between photocathode and the MCP. This structure is bonded together in a sealed off vacuum tube, such that high vacuum conditions are maintained for proper operation of the photocathode.

In addition, photocathodes of the invention may be used for uv sensing in higher temperature environments. Examples include but are not limited to flame detection (accelerants from surface to air missiles and shoulder harnessed rockets or heat generated by the fast moving objects), UV light imaging in space and terrestrial ambients, or any other real time detection of hot bodies emitting in the uv part of the spectrum involving imaging, such as drill bits moving through earth, bedrock, etc., in oil or other precious ore drilling operations.

BRIEF DESCRIPTION OF THE DRAWINGS

FIG. 4 is a block diagram of a photocathode fabrication method according to an embodiment of the invention.

DETAILED DESCRIPTION

Figures 1, 2:
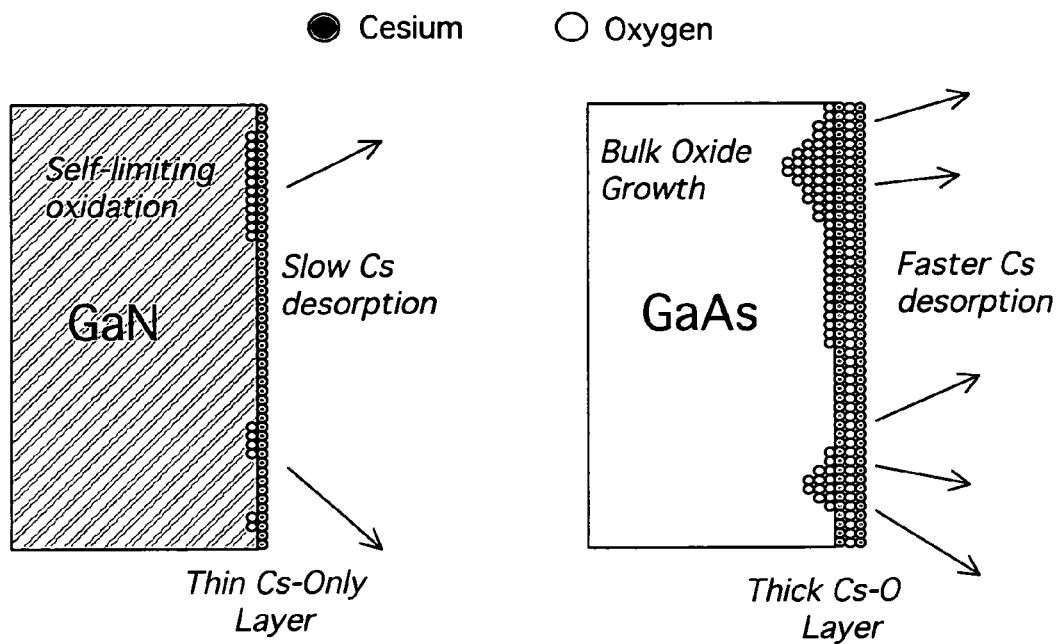
FIG. 1 shows a photocathode according to an embodiment of the invention.
FIG. 2 shows a conventional photocathode.

Methods for making improved photocathodes according to embodiments of the invention are described below in connection with FIG. 4. The remainder of the detailed description provides details on the performance (including experimental results) and applications of photocathodes according to embodiments of the invention.

The need for a high performance (low energy spread <0.5 eV, long lifetime >3 months per spot, emission stability <1%/ hour) electron source continues as part of the development of new e-beam writing and inspection tools. We present measurements from a group III-nitride (indium gallium nitride) photocathode in a demountable vacuum system to measure energy spread, lifetime, and preliminary blanking effects. We show the results of photocathodes operating in ultra high vacuum (UHV), high vacuum(HV) and oxygen rich backpressures. Our results show InGaN has a longitudinal energy spread of <300 meV in reflection mode, flat lifetimes of 60 hours per illuminated spot where the yield changes by <10%, and stable emission with typical recoveries within 99% of original photocurrent for all blanking periods and vacuum conditions tested (0.5 to 10 minute periods).

The "negative electron affinity" (NEA) photocathode continues to be an attractive candidate as an electron source for the following reasons, they exhibit large quantum efficiencies (>10%) with the potential for large current density operation, the lowest reported energy spread for the emitted current (<0.1 eV), and they offer a practical means of creating and modulating a large array of emission spots. In light of these excellent properties, the transition from detector based applications to practical electron sources has been hampered by issues relating to long term stability operating at larger current densities, as considered in Arcuni et al., J. Vac. Sci. Technol. B 19 (6), 2585 November/December (2001) and in Sen et al., J. Vac. Sci. Technol. B 16, 3380 (1998).

Our previous studies (Machuca et al., J. Vac. Sci. Technol. B 20(6), November/December 2002) with NEA photocathodes have shown more robust emission from wide bandgap semiconductors in a demountable vacuum system in comparison to the traditional smaller gap materials such as GaAs, typically used in night vision applications. In addition, a wide bandgap emitter allows the use of a simple cesium layer to achieve the NEA activation of the photocathode surface (F. Machuca, Ph.D. thesis, Electrical Engineering Department, Stanford University, 2003). In this study we identify an NEA emitter from the family of ternary semiconductors of indium gallium nitride (InGaN), a member of the group III-nitrides. The use of an InGaN photocathode allows us to test the emission properties of a wide bandgap material while tuning the operation wavelength (threshold for photoemission) to more practical illumination wavelengths. The focus of this work is measuring the photocathode lifetime within demountable vacuum, the quality of the emitted current as determined by the longitudinal energy spread, and testing for recovery effects of the InGaN to blanking of the illumination light within various vacuum environments.

The photocathodes were thin single crystal (wurtzite structure) InGaN layers, 0.1 μm to 1.0 μm thick, p-type layer ~$1\times10^{18}$ cm$^{-3}$ (Mg doped), on a thin AlN buffer layer (back diffusion barrier), all films were grown on a c-axis double side polished sapphire substrate, without any anti-reflection coating (approximately 200 um thick, 21 mm diameter). The Indium mole fraction was estimated by the grower to be 10% which theoretically decreases the band gap from 3.4 eV of GaN to 2.9+/−0.2 eV. Cathodal luminescence measurements verified the Indium mole fraction to be slightly lower than 10% (expecting closer to 3.0 eV gap). In addition, a four point probe measurement measured a 6 ohm-cm conductivity for the p-type film.

Our experiments involving InGaN spectral yield curves, photocathode lifetime, and blanking effects were performed using a UHV system with typical base pressures $\leq 10^{-10}$ Torr. The system is equipped with a HV to UHV transfer system, UHV heater, Cs doser employing Saes getter's channels, biased wire for collecting photocurrent, and illumination view ports.

The small fraction of indium within the film leads to similar chemical properties to those of gallium nitride. Hence the same chemical cleaning techniques were used from previous reports on GaN (Machuca et al., J. Vac. Sci. Technol., A 20(5), 1784 2002). Briefly, the samples were treated with a hot (90-120 C) sulfuric acid to hydrogen peroxide solution in a ratio of 4:1 for 10-12 minutes. Followed by several deionized water rinses and blown dry with argon. The samples were mounted in a molybdenum sample receiver and air transferred into a high vacuum load lock. The sample was pumped down with a turbo overnight for approximately 12 hours and moved into UHV chamber.

Next the samples were heat cleaned. The following heat cycle was used, 500 C, 600 C, 650 C and finally a 700 C, all temperatures held for 10 minute periods. Then the photocathodes were cooled for one hour. Temperature was previously calibrated for a GaN film using a thermocouple, physically in contact with the surface. Errors were estimated in the range of +/−30 C from the quoted values.

The activation was performed using 325 nm laser light (HeCd), guided through a single mode, 2 um core fiber, with 10 uW power, giving an approximate spot of 0.5 mm to 1 mm. The photocurrent was collected on a biased wire, 3 to 5 inches in direct line of sight of the photocathode (reflection mode), and applying 50-60 volts. The InGaN photocathode was activated by turning on a Saes Getter's Cs channel and monitoring the photocurrent via a Keithley amplifier, data was recorded with a strip chart using Labview software. The activation took 3 to 5 minutes of cesiation after the channel warmed up for approximately 1 minute. This activation lead to the photocurrent increasing by several orders of magnitude. The final photocurrent collected was 0.58+/−0.02 Volts using $10^6$ V/A gain. Note the dark/leakage photocurrent rose to approximately 30-40 pA after cesiating within the system. The highest initial yield corresponds to 19% quantum efficiency at 325 nm. The quantum efficiency varied by approximately 10% over 12 sample points along a line, and each point was separated by 1 mm on the photocathode.

A similarly equipped UHV system was used for measuring energy spread with a hemispherical energy analyzer typically used for high resolution photoemission electron spectroscopy at Stanford Synchrotron Radiation lab (<50 meV energy resolution).

Blanking effect measurements of the InGaN photocathode were undertaken in response to slow frequency modulation of 325 nm laser illumination and under various vacuum conditions. Total vacuum pressures from UHV to HV were tested along with an oxygen rich environment. All vacuum pressures were measured with a 200 amu residual gas analyzer (RGA), which is located at approximately 5-8 inches away from the nominal photocathode position. The UHV and HV pressures where achieved by cutting off the pumping speed of the main ion pump via a gate valve. And the final $2\times10^8$ Torr pressure was achieved by cutting all pumping speeds by completely valving off pumps. Throughout these pressure measurements, the photocathode remained within the load lock. The 325 nm light was focused onto the photocathode in reflection mode, and the photocurrent was collected on a bias wire (340 Volts, several inches from the photocathode surface). The light was modulated using the Newport electrically controlled shutter, blanking light for periods of 30 sec, 1 min., 2 min., 5 min., and 10 min. Both the recovery and rise/fall time of the photoresponse were measured as the light was modulated. The data sampling rate during modulation was 60 samples per minute.

FIG. 1 shows a photocathode according to an embodiment of the invention.

FIG. 2 shows a conventional photocathode.

Figure 3:
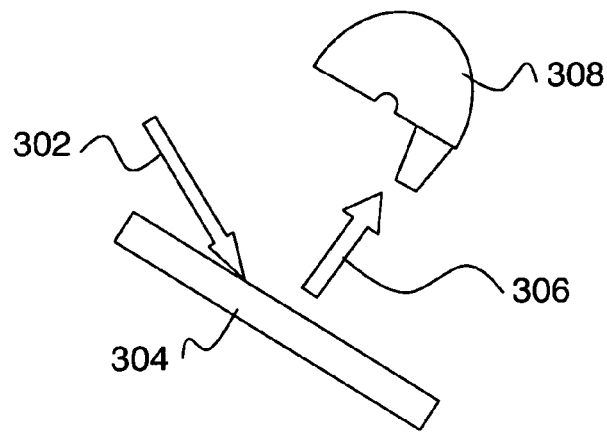
FIG. 3 shows an arrangement for measuring photocathode performance.

FIG. 3 shows an arrangement for measuring photocathode performance. A fiber coupled HeCd laser (λ=325 nm) having a power output of about 5-10 μW illuminates a photocathode under test 304 (typical sensitivity is 10-50 μA/mW) with an optical beam 302. Emitted electrons 306 are received by a hemispherical energy analyzer 308 having a resolution <50 meV.

FIG. 4 is a block diagram of a photocathode fabrication method according to an embodiment of the invention. Step 402 is providing a substrate having a group III-Nitride light absorbing region. Preferably, the substrate configuration has the light absorbing region disposed as an epitaxial layer on a transparent substrate (e.g., sapphire), although the invention can be practiced with any suitable substrate. Methods for providing substrates having this or similar configurations are well known in the art, and are all suitable for practicing the invention. Substrates can be grown with MBE, MOCVD, and/or Hydride vapor phase epitaxy. Alternatively, conventional techniques can be modified and/or combined. For example, the active III-nitride layer can be grown via known techniques onto a standard supporting substrate and a transparent layer can be spun on (such as spin on glass), chemically grown, or physically deposited on top of the active III-nitride layer. Then the supporting substrate can be removed through etching techniques, and/or chemical mechanical polishing, leaving the transparent layer and the active III-nitride layer intact.

Conventional dry cleaning techniques (e.g., ion bombardment) tend to damage the emission surface, and such damage may not be removable by annealing. To avoid such surface damage, step 404 is chemically cleaning an emission surface of the light absorbing region with a wet chemical process. Cleaning in a 4:1 mixture of sulfuric acid and hydrogen peroxide for 10 minutes at >90 C has been found suitable for practicing the invention. The invention can also be practiced by modification of this specific recipe and/or substitution of similar cleaning solutions.

The chemical cleaning of step 404 does not completely remove surface contamination. However, it does tend to transform surface contaminants into volatile species that can be removed by subsequent heat treatment. The two step heat treatment of the embodiment of FIG. 4 has been developed as an improvement of a conventional single step heat treatment. More specifically, in a preferred embodiment, the heat treatment is performed by ramping the temperature from 400 C to 700 C over a period of one hour, and introducing an ammonia atmosphere (preferably 10-100 Langmuirs of 99.9999% pure ammonia) during the last ten minutes of the temperature ramp. In this example, step 406 (first phase) is the first 50 minutes of the temperature ramp, while step 408 (second phase) is the last 10 minutes of the temperature ramp. The controlled temperature ramp is helpful for avoiding the cracking of oxides of carbon to form refractory graphitic carbon, which is an undesirable process that tends to occur easily at the hexagonally-symmetric surfaces of group III nitrides.

During the first phase, the sample being treated is preferably kept under vacuum (pressure preferably less than $5 \times 10^{-9}$ Torr, and more preferably as low as possible). Exposure of the sample to ammonia during step 408 and not during step 406 is preferred for providing a nitrogen-containing atmosphere to the sample during the higher temperature part of the heat treatment. This tends to improve the stoichiometry of the emission surface, since nitrogen desorption at high temperatures is reduced by providing a proper over pressure of nitrogen during the final (i.e., highest temperature) phase of the heat treatment. Another observation contributing to development of this process is that at sub-monolayer oxygen levels, refractory oxides are not present on the emission surface. Thus it is not necessary to employ a heat treatment having temperatures high enough to blow off a refractory oxide. A key idea of this cleaning process is to do as much as possible at low temperatures where nitrogen desorption is negligible (i.e., step 406) and in step 408 where nitrogen desorption can be an issue (due to elevated temperatures), an ammonia atmosphere is preferably provided. Nitrogen desorption has been observed at temperatures >750 C, since the measured surface ratio of Ga:N was no longer 1:1 (which it should be for an unreconstructed (1000) Ga terminated crystal). Although this was only tested on hexagonal surfaces, the bond enthalpy is such that a similar threshold temperature should hold for the cubic crystal lattice as well.

Step 410 is activating the cleaned emission surface. As described above, this activation is performed with Cs but not with oxygen. The resulting Cs-only activated emission surface has been found to provide improved performance compared to conventional Cs—O activated emission surfaces.

Figure 5:
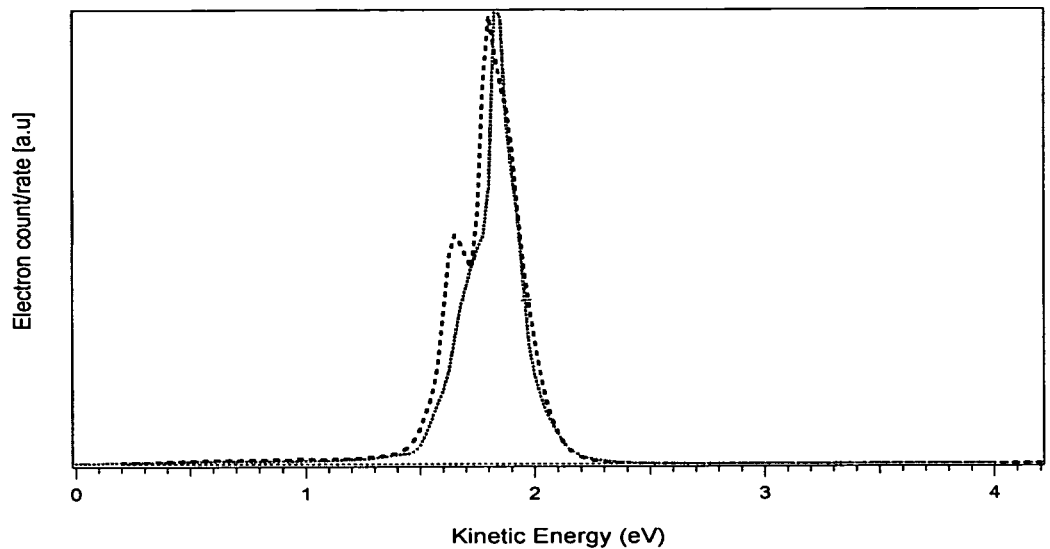
FIG. 5 shows results of an energy spread measurement from a photocathode according to an embodiment of the invention.

FIG. 5 shows results of an energy spread measurement from a photocathode according to an embodiment of the invention.

A HeCd laser, 325 nm, 5-10 uW (fiber coupled), was used at SSRL/Stanford University within a UHV photoelectron spectroscopy system. This system is equipped with a hemispherical energy analyzer with an energy resolution <50 meV. The InGaN photocathode was activated and a sensitivity of 10-50 uA/mW was achieved prior to performing the energy spread measurement. The energy spread was measured in reflection mode.

The energy spreads shown in FIG. 5 were measured before and after the steady state quantum efficiency was achieved, the energy spread was approximately 200 meV in reflection mode after one day. This is a worst-case scenario measurement and an upper bound for the expected energy spread in transmission mode for InGaN. Nonetheless, these energy spreads are extremely low and characteristic of NEA photocathode emission. This would correspond to a source angle of 2 mrad for an e-beam tool operating at 50 kV.

Figure 6:
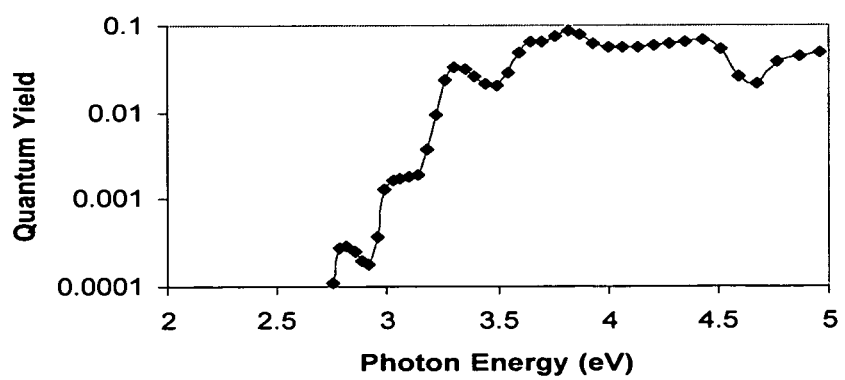
FIG. 6 shows a spectral yield measurement from a photocathode according to an embodiment of the invention.

FIG. 6 shows a spectral yield measurement from a photocathode according to an embodiment of the invention.

The spectral yield curve of InGaN was measured with a mercury discharge lamp focused through a monochromator, with a resolution of +/−0.5 nm. The power at each wavelength was measured on a bench top using a Newport UV-visible photodetector and power meter. The resulting spectral yield curve is plotted in FIG. 6. Assuming the <10% In mole fraction in InGaN gives a 3.0 eV +/−0.2 eV band gap, the spectral yield curve verified the NEA activation of InGaN with Cs alone, i.e. the threshold for photoemission is at the band gap of the semiconductor. More importantly, the InGaN photocathode is an efficient emitter at 3.4 eV, which corresponds to 365 nm to 375 nm illumination, making this photocathode practical from an engineering stand point (known i-line technology and Nichia uv-violet lasers). Furthermore, adding 1-5% more Indium can decrease the response in energy, such that 405 nm light can be used. Such a photocathode can be coupled to high power semiconductor lasers, i.e. Vcsels, or Nichia blue lasers.

Figure 7A:
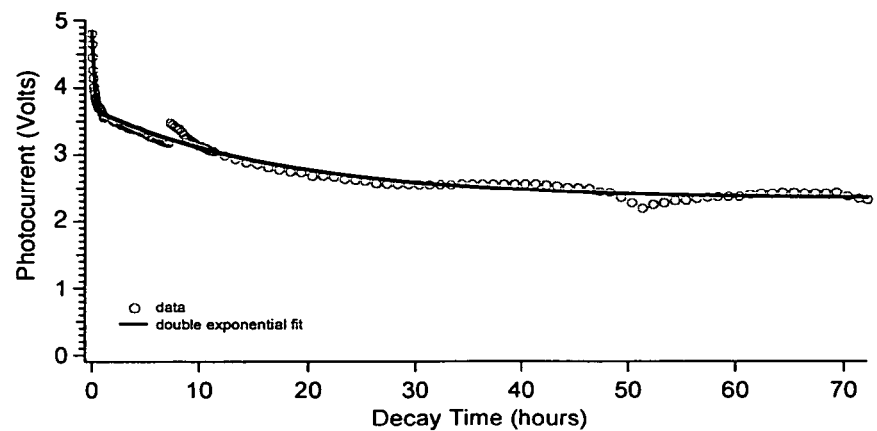
FIGS. 7a-b show lifetime tests of photocathodes according to embodiments of the invention.
Figure 7B:
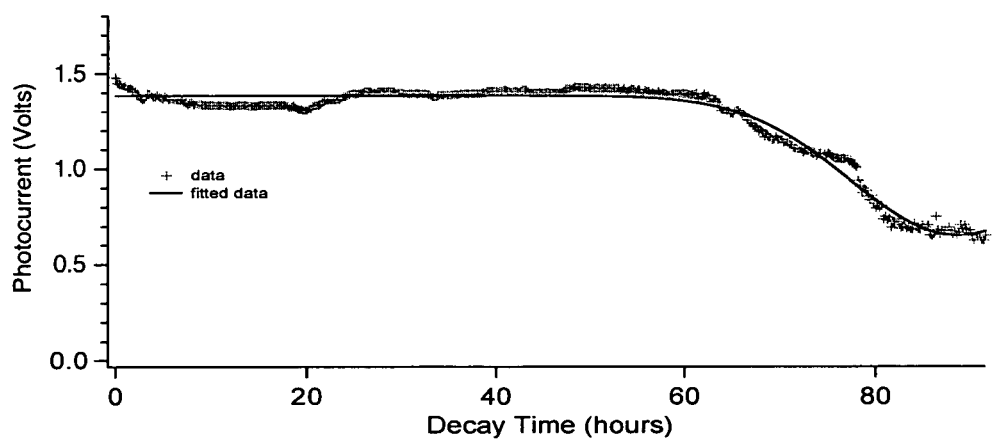

FIGS. 7a-b show lifetime tests of photocathodes according to embodiments of the invention.

The lifetime of the InGaN photocathode was monitored using 325 nm light, focused to a 0.5 mm diameter within demountable UHV ($10^{-10}$ Torr). A spot was chosen with an approximate sensitivity of 1.4 μA/mW and a current density of approximately 1 mA/cm$^2$. This measurement was taken after a period of storage for a week and half within UHV, without any form of reactivation, and the results are shown on FIG. 7b. The results of a lifetime test after the initial activation is shown on FIG. 7a. Briefly, a small initial drop was observed in the photocurrent over the first 1-3 hours (prior to reaching a steady state) and a similar stable plateau ensued over approximately 60 hours.

The lifetime shows a slowly varying photocurrent of 1.4+/−0.1 μA (measured nominally 1.4 V, at 10$^6$ V/A Gain), within 10% changes, over the first 67 hours of the decay. Then the yield dropped by a factor of 2 over the subsequent 24 hours tested.

This data represents the characterization of a second emission spot with stable lifetime a week and half after the initial activation. This verifies the efficiency of the InGaN photocathode over one week periods of UHV storage, unilluminated. Secondly, no initial transient drop in the photocurrent was observed after illumination began, as in representative decay data starting immediately after the initial activation. This suggests that an NEA photocathode should not be used within the first 1 to 5 hours over which the quantum efficiency is reaching a steady state. This "seasoning" of the photocathode is most likely due to a non-equilibrium coverage of cesium and/or initial gettering of elements in the vacuum, i.e. background oxygen, etc. This was also observed with the double peaked energy spread, which after the first day moved towards a single peaked energy distribution. Losing a fraction of the energy distribution is consistent with the initial drop in the total quantum efficiency followed by the plateau in lifetime.

Achieving an NEA property on the group III-nitride surfaces without the traditional cesium oxide activation layer ensures a key requirement for the multiple e-beam source, a long life time of operation under low vacuum requirements (FIGS. 7a-b). Cesium oxide undergoes various chemical changes that adversely affect the dipole strength of the activation layer on photocathodes. This change occurs independent of electron stimulated desorption which is a special concern for e-beam lithography considering the high current densities 0.1-1000 Amps/cm$^2$ required for high throughput printing and high speed inspection.

The long lifetime observed for InGaN photocathodes is attributed to several factors. First, $In_xGa_{1-x}N$ is relatively chemically inert for small x (like GaN). Second, the absence of a bulk oxidation process in this material system advantageously increases longevity. Third, stability is enhanced by relatively strong binding of Cs to the group III-nitride surface.

Figure 8A:
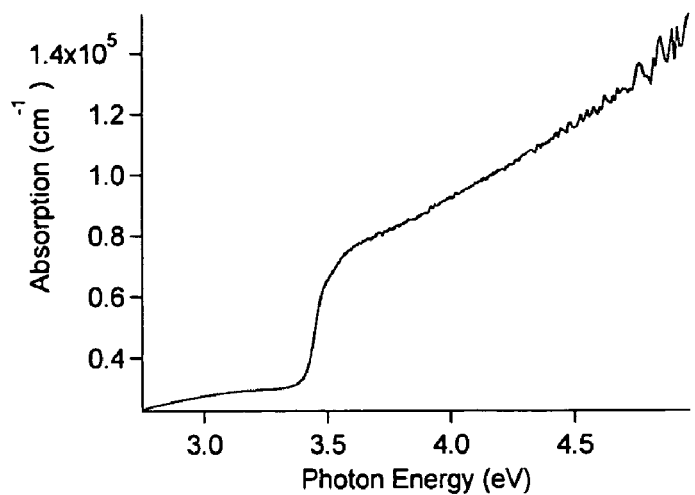
FIG. 8a shows absorption vs. energy for a GaN active layer.

FIG. 8a shows absorption vs. energy for a GaN active layer.

In operation, electromagnetic radiation (200 nm to 450 nm light) is incident from the backside of the heterostructure, the sapphire substrate acts as this backside window. The light is transmitted through the sapphire, with approximately less than or equal to 10% reflective losses over the wavelengths of interest, and is passed through the thin buffer layer. The light then enters the group III-nitride active layer and is absorbed with absorption strength of approximately $10^5$ cm$^{-1}$ or greater. FIG. 8a shows the absorption characteristics as a function of energy (spanning wavelengths of 450 nm down to 250 nm) in transmission mode for a typical GaN active layer, one possibility for a group III-nitride emitter. Hence the 0.1 micrometer layer thickness affords approximately 60% absorption of the light intensity at threshold of absorption. The light photogenerates electrons and holes in the active layer, the electrons quickly thermalize and diffuse and/or drift (if a graded band gap or significant depletion layer exists) to the front surface of the active layer. The carriers see no barrier to emission owing to the NEA activation layer and are readily emitted.

Figure 8B:
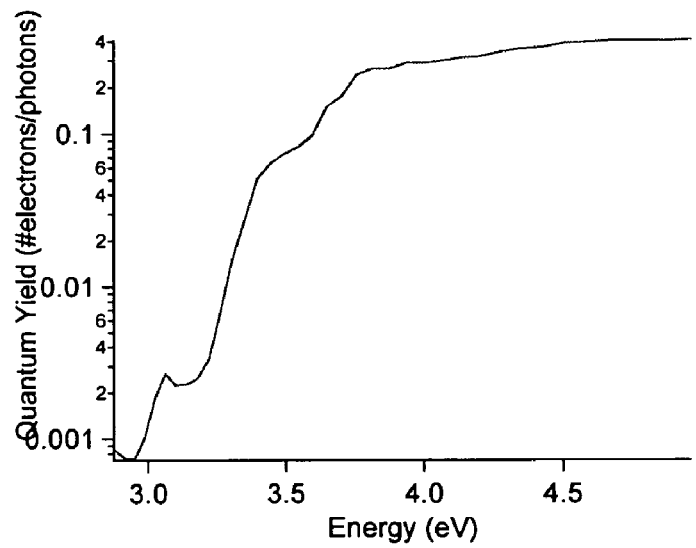
FIGS. 8b-c shows yield vs. energy for a photocathode according to an embodiment of the invention having a GaN active layer in reflection and transmission mode respectively.
Figure 8C:
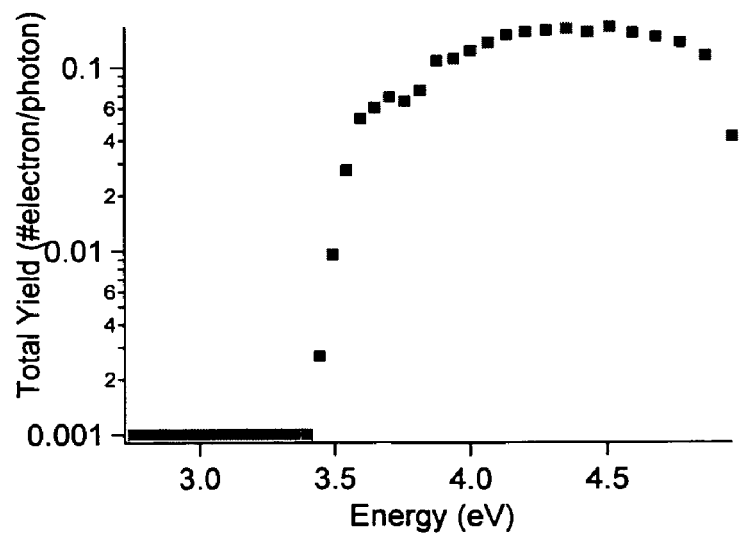
Figure 9A:
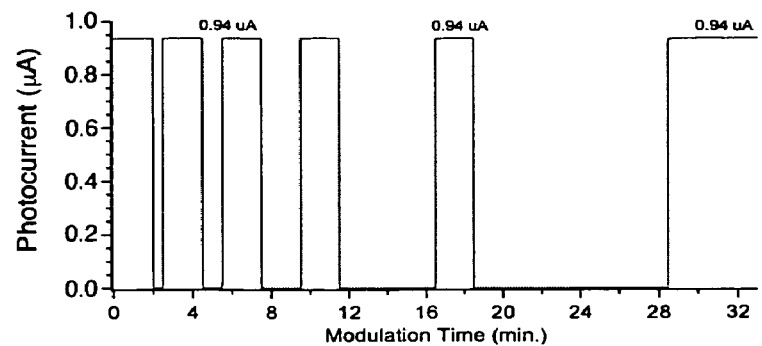
FIGS. 9a-d show blanking at various pressures of photocathodes according to embodiments of the invention.
Figure 9B:
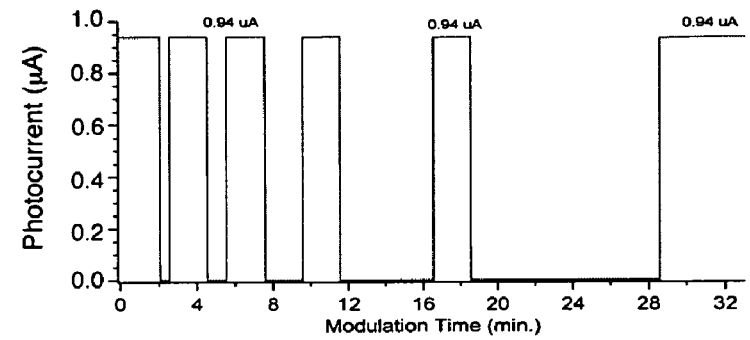
Figure 9C:
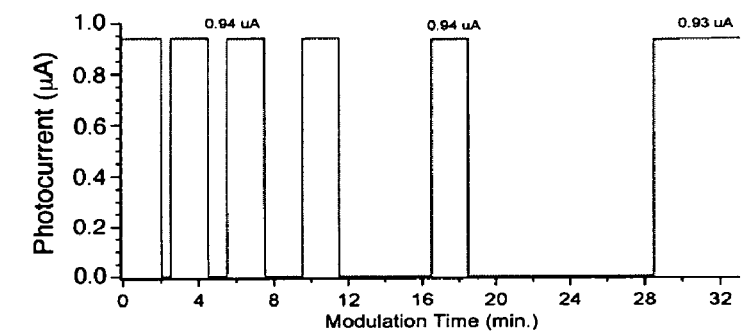
Figure 9D:
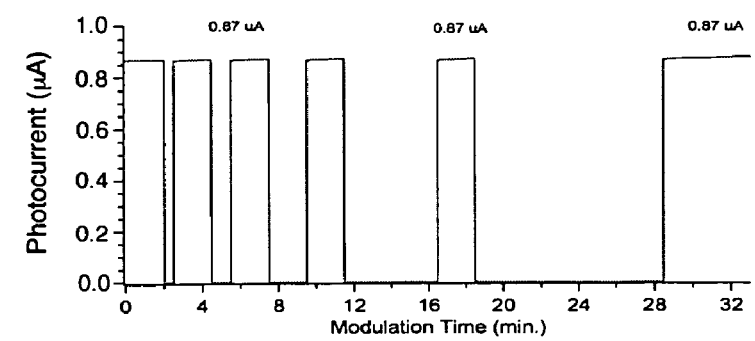

FIGS. 8b-c shows yield vs. energy for a photocathode according to an embodiment of the invention having a GaN active layer in reflection and transmission mode respectively.

The efficiency of a GaN transmission mode photocathode can be seen in FIGS. 8b-c, where the quantum efficiency is plotted as a function of incident photon energy (equivalent to 450 nm to 250 nm light). The high efficiency is an enabling property leading to high sensitivity for devices employing this wide bandgap photoemitter and is achievable with a cesium activation layer without oxygen.

FIGS. 9a-d show blanking at various vacuum system base pressures of photocathodes according to embodiments of the invention.

We show in FIGS. 9a-d for 30 sec, 1 min, 2 min, and 10 min blanking periods, the recovery of the photocurrent was within 99% of the starting value for all pressures tested. The 10% to 90% rise and fall times were much less than the sampling rate of one data point every second. In addition, this photocathode has been tested in a streak tube measurement stand at SLAC, and provides 1-4 picosecond time response (Ioakeimidi et al., IEEE Transactions on Microwave Theory and Techniques 53(1), p1986 2005). Hence switching speed is not expected to be an issue in any practical lithography tool.

Figure 10:
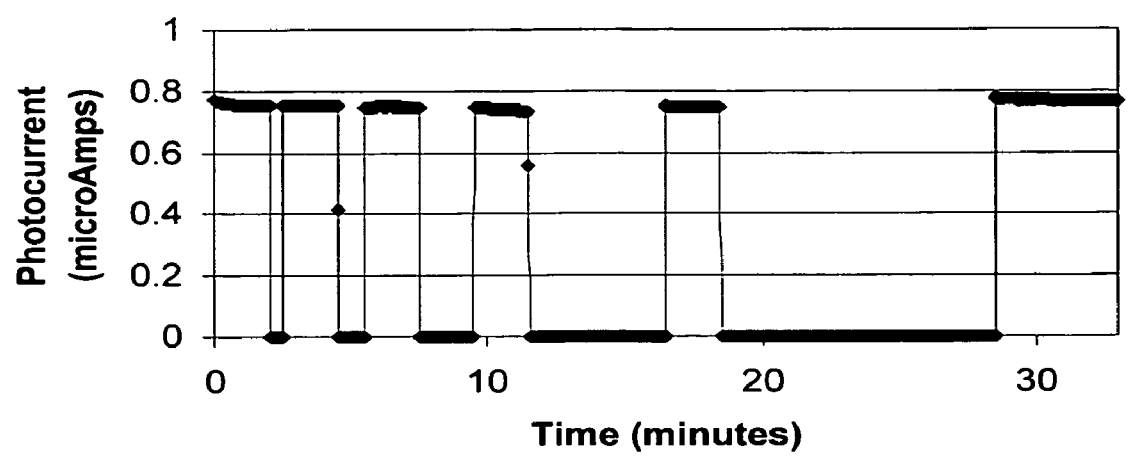
FIG. 10 shows blanking in an oxygen-rich environment of a photocathode according to an embodiment of the invention.

FIG. 10 shows blanking in an oxygen-rich environment of a photocathode according to an embodiment of the invention.

In addition to increasing total pressure, the blanking effect was tested within an oxygen rich environment. A leak valve was adjusted and the partial pressure of oxygen was measured and calibrated by using a RGA. An oxygen partial pressure relationship to the number of open turns on the leak valve was determined for subsequent controlled dosing experiments. Throughout these calibration measurements the photocathode remained isolated from the hot RGA filament within the load lock of the system.

The photocathode was reintroduced into the UHV system and exposed continuously to pressures ranging from $10^{-12}$ Torr to $10^{-7}$ Torr of oxygen for the blanking periods described above. The photocathode recovered to within 99% of its unshuttered photocurrent for all blanking times except at the exposure level of $10^{-7}$ Torr partial pressure of oxygen. The onset for a blanking effect was observed and is shown in FIG. 10. At $10^{-7}$ Torr partial pressure of oxygen the photocathode recovery after each blanking period was within 97%, 99%, 99%, 97%, and 96% of the initial photocurrent, respectively.

Cesiated, single-crystal InGaN photocathodes have been shown to have quantum efficiencies in the range 5 to 19% for illumination wavelengths between 365 and 400 nm. The emitted electrons have an energy spread in the range of 200 meV (at steady state) to 400 meV (immediately after initial activation) in reflection mode; in transmission, when carriers are completely thermalized, this photocathode should exhibit energy spreads between 100 meV and 200 meV. Lifetimes (less than 1% decay) of 60 hours were observed.

This photocathode has shown to be robust to poor vacuum. For example no noticeable blanking effect was observed up to $2 \times 10^{-8}$ Torr. When the dominant contaminants are those from outgassing from stainless steel parts (mostly hydrogen, some hydrocarbons, and CO) and the partial pressures of gases such as oxygen and moisture are $<10^{-12}$ Torr. In an oxygen-rich environment the effect of blanking was less than 3% at pressures approaching $10^{-7}$ Torr; this is several orders of magnitude higher than required for complete poisoning of more traditional NEA photocathodes such as GaAs.

The invention claimed is:

1. A method for fabricating a photocathode, the method comprising:
   providing a substrate including a light-absorbing region including a material having a composition AN, wherein A is a group III element or a mixture or alloy of group III elements, and wherein N is Nitrogen, and wherein a surface of the light-absorbing region is also an emission surface of the substrate;
   chemically cleaning the emission surface with a wet chemical process;
   heat treating the substrate after the cleaning, wherein the heat treatment includes a first phase preceding a second phase, wherein the second phase is at a higher temperature than the first phase, and wherein the temperature during the first phase is at least 300C;
   activating the emission surface after said heat treating by providing Cesium (Cs) to the emission surface and by not providing Oxygen to the emission surface, whereby Cs-only activation is obtained.

2. The method of claim 1, wherein said emission surface is exposed to a vacuum during said first phase.

3. The method of claim 2, wherein said vacuum has a pressure of less than $5 \times 10^{-9}$ Torr.

4. The method of claim 1, wherein said emission surface is exposed to an ammonia atmosphere during said second phase.

5. The method of claim 4, wherein said ammonia atmosphere comprises 10-100 Langmuirs of ammonia having a purity of 99.9999% or greater.

6. The method of claim 1, wherein said heat treatment includes a temperature ramp from 400 C to 700 C over a time span of an hour.

7. The method of claim 6, wherein said emission surface is exposed to an ammonia atmosphere during said second phase, and wherein said second phase is the last ten minutes of said time span.

* * * * *